(12) United States Patent
Yoo et al.

(10) Patent No.: US 12,174,683 B2
(45) Date of Patent: Dec. 24, 2024

(54) SYSTEM ON CHIP AND APPLICATION PROCESSOR

(71) Applicant: Samsung Electronics Co., Ltd., Suwon-si (KR)

(72) Inventors: Junhee Yoo, Yongin-si (KR); Jaehyun Kim, Incheon (KR); Jingyu Ahn, Seoul (KR); Wooil Kim, Suwon-si (KR); Manhwee Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 17/956,195

(22) Filed: Sep. 29, 2022

(65) Prior Publication Data

US 2023/0104271 A1    Apr. 6, 2023

(30) Foreign Application Priority Data

Oct. 1, 2021 (KR) .................. 10-2021-0131137

(51) Int. Cl.
*G06F 1/3234* (2019.01)
*G11C 7/22* (2006.01)

(52) U.S. Cl.
CPC ............ *G06F 1/3234* (2013.01); *G11C 7/222* (2013.01)

(58) Field of Classification Search
CPC .............................. G06F 1/3234; G11C 7/222
See application file for complete search history.

(56) References Cited

U.S. PATENT DOCUMENTS

| | | | |
|---|---|---|---|
| 5,815,725 A * | 9/1998 | Feierbach ................. | G06F 1/32 713/601 |
| 5,872,903 A | 2/1999 | Iwata et al. | |
| 9,430,434 B2 | 8/2016 | Lo et al. | |
| 10,114,448 B2 | 10/2018 | Haj-Yihia et al. | |
| 10,254,813 B2 | 4/2019 | Jung et al. | |
| 10,474,224 B2 | 11/2019 | Pulivendula et al. | |
| 10,649,929 B2 | 5/2020 | Hwang | |
| 2002/0108070 A1 | 8/2002 | Oh | |
| 2004/0246810 A1* | 12/2004 | Dike ...................... | G11C 7/222 365/233.1 |

(Continued)

FOREIGN PATENT DOCUMENTS

EP         2073097 A2    6/2009
WO   WO-2016-105864 A1   6/2016

OTHER PUBLICATIONS

Partial European Search Report dated Feb. 23, 2023 for corresponding European Application No. 22198012.1.

(Continued)

*Primary Examiner* — Nimesh G Patel
(74) *Attorney, Agent, or Firm* — Harness, Dickey & Pierce, P.L.C.

(57) ABSTRACT

A system on chip (SoC) and an application processor are provided. The SoC includes a memory controller configured to control a memory; a plurality of function modules configured to access the memory through a memory interface; a system interconnect circuit configured to operate based on a first clock signal and connect the memory interface and the plurality of function modules; and a power controller configured to control the first clock signal to be periodically gated, and control the memory to operate in a lower-power mode during a period in which the first clock signal is gated.

20 Claims, 15 Drawing Sheets

(56) References Cited

U.S. PATENT DOCUMENTS

| | | | |
|---|---|---|---|
| 2008/0057896 A1 | 3/2008 | Kim et al. | |
| 2009/0248911 A1 | 10/2009 | Conroy et al. | |
| 2011/0283124 A1 | 11/2011 | Branover et al. | |
| 2012/0023363 A1* | 1/2012 | Shaeffer | G06F 12/00 711/E12.001 |
| 2012/0102344 A1* | 4/2012 | Kocev | G06F 1/3287 713/322 |
| 2013/0042127 A1 | 2/2013 | Thomas et al. | |
| 2013/0124907 A1 | 5/2013 | Aoki | |
| 2014/0108848 A1* | 4/2014 | Okada | G06F 1/3237 713/501 |
| 2014/0181560 A1 | 6/2014 | Muralidhar et al. | |
| 2015/0192982 A1* | 7/2015 | Raad | G06F 1/3237 713/322 |
| 2016/0091957 A1 | 3/2016 | Partiwala et al. | |
| 2016/0109928 A1 | 4/2016 | He et al. | |
| 2017/0212576 A1* | 7/2017 | Lee | H04L 49/109 |
| 2019/0354300 A1* | 11/2019 | Benisty | G06F 3/0634 |
| 2020/0051604 A1* | 2/2020 | Zamani | H03K 19/20 |

OTHER PUBLICATIONS

Extended European Search Report issued on Jun. 15, 2023 in European Application No. 22198012.1.

\* cited by examiner

SYSTEM ON CHIP AND APPLICATION PROCESSOR

CROSS-REFERENCE TO RELATED APPLICATION

This application is based on and claims priority under 35 U.S.C. § 119 to Korean Patent Application No. 10-2021-0131137, filed on Oct. 1, 2021, in the Korean Intellectual Property Office, the disclosure of which is incorporated by reference herein in its entirety.

BACKGROUND

The inventive concepts relate to a system on chip (SoC), and more particularly, to a SoC and an application processor that synchronize operations of components in a system.

A system on chip (hereinafter referred to as SoC) is a technology for integrating a complex system having various functions into a single semiconductor chip. According to the convergence trend in which computers, communications, broadcasting, etc. are integrated, the demand for application-specific ICs (ASICs) and application-specific standard products (ASSPs) is shifting to SoCs. In addition, compact and lightweight information technology (IT) devices are promoting SoC-related businesses.

When the SoC operates in a lower-power mode, the system may operate using a race to idle method in which the system operates for a short time and takes a long idle period for power efficiency of the system. To this end, it is required or desired that the components in the system are synchronized to operate.

SUMMARY

The inventive concepts provide a system on chip (SoC) and an application processor to increase power efficiency in a lower-power mode.

According to an aspect of the inventive concepts, there is provided a system on chip (SoC) including a memory controller configured to control a memory; a plurality of function hardware configured to access the memory through a memory interface; a system interconnect circuit configured to operate based on a first clock signal and connect the memory interface and the plurality of function hardware; and a power controller configured to control the first clock signal to be periodically gated, and control the memory to operate in a lower-power mode during a period in which the first clock signal is gated.

According to another aspect of the inventive concepts, there is provided a plurality of function hardware configured to access a memory; a system interconnect circuit configured to operate based on a first clock signal and provide a data transmission path between the plurality of function hardware and the memory; and a power controller configured to receive an activity request signal from each of the plurality of function hardware, control gating and ungating of the first clock signal of the system interconnect circuit based on a plurality of activity request signals received from the plurality of function hardware, and control the memory to operate in a lower-power mode during a period in which the first clock signal is gated.

According to another aspect of the inventive concepts, there is provided an application processor including a plurality of function hardware; a shared module shared by the plurality of function hardware; an interconnect circuit configured to operate based on a first clock signal to connect the plurality of function hardware and the shared module; and a power controller configured to generate a gating control signal controlling the first clock signal to be periodically gated to provide the gating control signal to the interconnect circuit, and, based on a plurality of state signals received from the plurality of function hardware, adjust the gating control signal to maintain a state in which the first clock signal is gated or a state in which the first clock signal is used in the interconnect circuit.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments of the inventive concepts will be described in detail with reference to the accompanying drawings.

Figure 1:
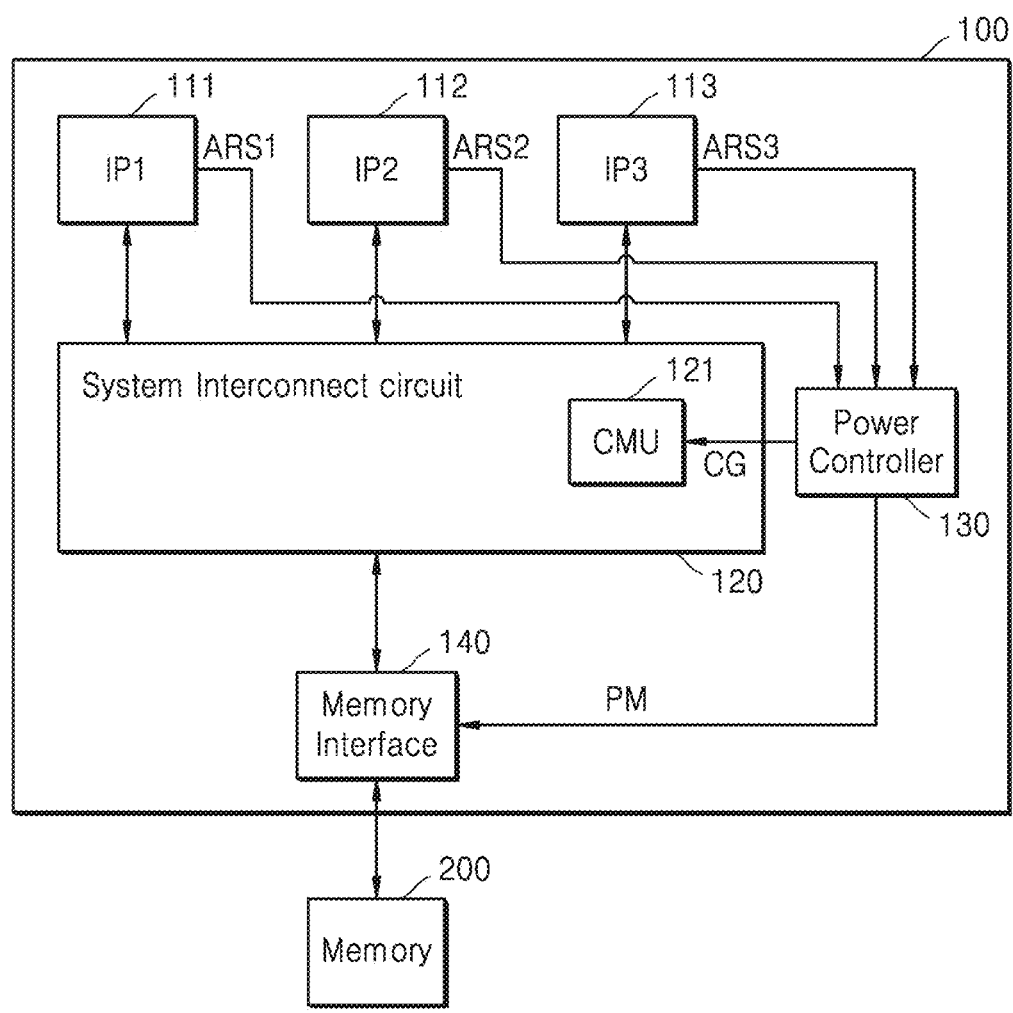
FIG. 1 is a block diagram illustrating a system on chip (SoC) according to an example embodiment of the inventive concepts.

FIG. 1 is a block diagram illustrating a system on chip (SoC) 100 according to an example embodiment of the inventive concepts.

The SoC 100 may be mounted in an electronic device. For example, the electronic device may be a mobile device such as a smart phone, a tablet personal computer (PC), a mobile phone, a personal digital assistant (PDA), a laptop, a wearable device, a global positioning system (GPS) device, an e-book terminal, a digital broadcasting terminal, an MP3 player, a digital camera, a wearable computer, etc. For example, the electronic device may be an Internet of things (IoT) device or an electric vehicle. The SoC 100 may be a controller or a processor that controls the operation of the electronic device. The SoC 100 may mean an application processor (AP), a mobile AP, or a control chip.

Referring to FIG. 1, the SoC 100 may include a plurality of circuitries 111, 112, and 113 (also referred to as function blocks or function modules in this disclosure), a system interconnect circuit 120, a power controller 130, and a memory interface 140. The system interconnect circuit 120, the power controller 130, or the memory interface 140 may also be one of the function blocks of the SoC 100.

Each of the plurality of function blocks 111, 112, and 113 may be a unit module designed to perform a specific function in the SoC 100 or a combination of unit modules, and may be referred to as an intellectual property (IP). For example, the first, second, and third function blocks 111, 112, and 113 may be referred to as IP1, IP2, and IP3, respectively. In an embodiment, configurations included in one function block may operate based on the same clock and voltage.

Each of the plurality of function blocks 111, 112, and 113 may mean a central processing unit (CPU), a graphics processing unit (GPU), a processor, each core of a multi-core processor, a power management unit (PMU), a clock management unit (CMU), a system BUS, a memory, a universal serial bus (USB), a peripheral component interconnect (PCI), a digital signal processor (DSP), a wired interface, a wireless interface, a controller, embedded software, codec, a video module (e.g., a camera interface, a Joint Photographic Experts Group (JPEG) processor, a video processor, or mixer, etc.), a 3-dimensional (3D) graphics core, an audio system, or a driver. The plurality of function blocks 111, 112, and 113 may be implemented as hardware, software (or firmware), or a combination of hardware and software. A function block or function module or an intellectual property that is implemented in hardware may be one of the plurality of circuitries.

In FIG. 1, the SoC 100 is illustrated as including the first function block 111, the second function block 112, and the third function block 113, but this is for convenience of description, and the number and type of the function blocks may be changed in various ways.

The memory interface 140 may provide an interface between a plurality of function blocks included in the SoC 100, for example, the first to third function blocks 111, 112, and 113 and the memory 200. The memory interface 140 may store data in the memory 200 by receiving data and a write request from the plurality of function blocks 111, 112, and 113, and transmitting the received data to the memory 200 together with an address and a write command. In addition, the memory interface 140 may read the data stored in the memory 200 by receiving a read request from the plurality of function blocks 111, 112, and 113, and transmitting a read command and an address to the memory 200. The memory interface 140 may transmit the read data to a function block to which the read request is transmitted among the plurality of function blocks 111, 112, and 113.

In an embodiment, the memory 200 may include a dynamic random access memory (DRAM), and the memory interface 140 may be implemented as a DRAM interface. However, the inventive concepts are not limited thereto, and the memory 200 may include a volatile memory such as DRAM, static random access memory (SRAM), or a non-volatile memory such as a flash memory, phase change RAM (PRAM), magnetic RAM (MRAM), resistive memory (ReRAM), ferroelectrics RAM (FRAM), etc.

The system interconnect circuit 120 may connect between configurations in the SoC 100, for example, between the plurality of function blocks 111, 112, 113 and the memory interface 140, and may provide a transmission path of data and/or signals between the plurality of function blocks 111, 112, and 113 and the memory interface 140. In an embodiment, the plurality of function blocks 111, 112, and 113 may be referred to as a master, and the memory interface 113 may be referred to as a slave. The master and the slave may be distinguished based on which has authority to use the system interconnect circuit 120.

In an embodiment, the system interconnect circuit 120 may be implemented as a network-on-chip (NoC) circuit. A NoC method is a method of connecting function blocks by applying a general network technology in a semiconductor chip. The system interconnect circuit 120 may include a router circuit and a switching circuit to provide the transmission path of data and/or signals between the plurality of function blocks 111, 112, and 113 and the memory interface 140.

In an embodiment, the system interconnect circuit 120 may be implemented as a bus to which a protocol having a certain standard bus standard is applied. For example, as a standard bus standard, an Advanced Microcontroller Bus Architecture (AMBA) protocol of Advanced RISC Machine (ARM) may be applied. Bus types of the AMBA protocol may include Advanced High-Performance Bus (AHB), Advanced Peripheral Bus (APB), Advanced eXtensible Interface (AXI), AXI4, AXI Coherency Extensions (ACE), etc. Among the bus types described above, AXI is an interface protocol between function blocks, and provides a multiple outstanding address function and a data interleaving function. In addition, other types of protocols such as uNetwork of Sonics Inc., CoreConnect of IBM, Open Core Protocol of OCP-IP, etc. may be applied to the system interconnect circuit 120.

The system interconnect circuit 120 may include a clock management circuit 121 (also referred to as a clock management unit (CMU)). The clock management circuit 121 may receive a source clock signal provided from outside or inside the SoC 100 and divide or delay the source clock signal to generate a plurality of internal clock signals. Hereinafter, in the inventive concepts, the source clock signal provided to the system interconnect circuit 120 will be referred to as a first clock signal.

The system interconnect circuit 120 may include a plurality of IPs in addition to the clock management circuit 121. The plurality of IPs may operate based on a corresponding internal clock signal among a plurality of internal clock signals generated based on the first clock signal. Here, the plurality of IPs may include interfaces, routers, switching circuits, etc.

The clock management circuit 121 may perform gating or ungating on the first clock signal. In the inventive concepts, gating a clock signal means blocking the clock signal from being input or blocking other clock signals from being generated based on the input clock signal. Ungating a clock signal means allowing the clock signal to be input or allowing other clock signals to be generated based on the input clock signal.

For example, when the first clock signal is gated, a plurality of internal clock signals may not be generated, and the operation of the system interface circuit 120 may be blocked. When the first clock signal is ungated, a plurality of internal clock signals may be generated, and a plurality of IPs included in the system interconnect circuit 120 may operate based on the plurality of internal clock signals, so that the system interface circuit 120 may operate normally. In this way, gating a reference clock signal of the plurality of clock signals used in a circuit, for example, gating the first clock signal input to the clock management circuit 121 of the system interconnect circuit 120, is referred to as root clock gating.

The power controller 130 may control the root clock gating of the SoC 100, and may control a power mode of the memory 200 according to the root clock gating. The power controller 130 may control the first clock signal of the system interconnect circuit 120 to be periodically gated, that is, to be root clock gated. In this case, within one cycle, a period in which the first clock signal is gated may be longer than a period in which the first clock signal is ungated. The power controller 130 may generate a clock gating control signal CG setting the first clock signal to be gated or ungated, and provide the clock gating control signal CG to the clock management circuit 121 of the system interface circuit 120. The clock management circuit 121 may gate or ungate the first clock signal based on the clock gating control signal CG. For example, when the clock gating control signal CG indicates gating enable (e.g., logic high), the clock management circuit 121 may gate the first clock signal, and when the clock gating control signal CG indicates gating disable (e.g., logic low), the clock management circuit 121 may ungate the first clock signal.

The power controller 130 may control the memory 200 to operate in a lower-power mode during the period in which the first clock signal is gated. For example, the lower-power mode of the memory 200 may include a self-refresh mode. In a self-refresh mode, a clock signal for input/output of the memory 200 may be blocked. The memory 200 may perform self-refresh to maintain stored data without transmitting/receiving data to/from the system-on-chip 100. Accordingly, a bandwidth of the memory 200, that is, a data transfer rate, may be zero, and power consumed in the memory 200 and the memory interface 140 may be minimized. During a period in which the memory 200 operates in the self-refresh mode, the memory 200 may be referred to as a low power operation state or an idle state.

The power controller 130 may generate a power mode signal PM indicating a power mode of the memory 200, and transmit the power mode signal PM to the memory interface 140. The power controller 130 may generate the power mode signal PM indicating a low power operation mode during the period in which the first clock signal is gated, and may generate the power mode signal PM indicating a high performance mode during the period in which the first clock signal is ungated.

When the power mode signal PM indicates the low power operation mode or the idle state, the memory interface 140 may control the memory 200 to enter and operate in the low power operation mode (or the idle state). When the power mode signal PM indicates the high performance mode, the memory interface 140 may control the memory 200 to enter and operate in a normal operation mode, and further control the bandwidth of the memory 200 to increase.

The power controller 130 may receive activity request signals ARS1, ARS2, and ARS3 from the plurality of function blocks 111, 112, and 113, respectively, and may control root clock gating, that is, gating of the first clock signal, based on the plurality of activity request signals ARS1, ARS2, and ARS3 received from the plurality of function blocks 111, 112, and 113, respectively. Each of the activity request signals ARS1, ARS2, and ARS3 received from the plurality of function blocks 111, 112, and 113, respectively, indicates a state of the corresponding function block. For example, when the function block attempts to access the memory 200, each of the activity request signals ARS1, ARS2, and ARS3 may have an active level. In other words, the activity request signal may indicate an access request to the memory 200 of the corresponding function block. In an embodiment, at least one of the plurality of function blocks 111, 112, and 113 may include a plurality of sub-function blocks (or a plurality of IPs), and may transmit a plurality of activity request signals respectively corresponding to the plurality of sub-function blocks to the power controller 130.

In an embodiment, the power controller 130 may control the first clock signal to be periodically gated as a default setting. Thereafter, the power controller 130 may control gating of the first clock signal based on the plurality of activity request signals ARS1, ARS2, and ARS3 received from the plurality of function blocks 111, 112, and 113. The power controller 130 may control the first clock signal to be ungated in response to the active level of the first activity request signal received from a function block having relatively high importance among the plurality of activity request signals ARS1, ARS2, and ARS3.

In an embodiment, a function block of relatively high importance may be, for example, a previously set function block, a function block that requires access to the memory 200 in real time, a function module with the highest performance, and/or a function block including a data queue. The function block including the data queue may transmit a first activity request signal having an active level to the power controller 130 when the data queue is full or empty.

In an embodiment, when all of the plurality of activity request signals ARS, ARS2, and ARS2 have inactive levels, the power controller 130 may control the first clock signal to be gated.

In an embodiment, a root clock gating rule set according to the plurality of activity request signals ARS1, ARS2, or ARS3 may be implemented in hardware in the power controller 130.

In an embodiment, when the SoC 100 is in the low power operation mode, the power controller 130 may reduce power consumption through the root clock gating of the first clock signal as described above, and when the SoC 100 is in the normal operation mode or the high performance mode, the power controller 130 may adjust a dynamic voltage and frequency scaling (DVFS) level of each of the plurality of function modules 111, 112, 113 and the system interconnect circuit 120, thereby reducing power consumption. In an embodiment, root clock gating and DVFS methods may be mixed.

As described above, in the SoC 100 according to the example embodiment of the inventive concepts, the power controller 130 controls the first clock signal to be periodically gated, that is, controls the system interconnect circuit 120 to periodically operate, and thus the plurality of function blocks 111, 112, 113 may be synchronized to operate, and the idle period of the system and the memory 200 may be increased. Accordingly, power consumption of the memory 200 and the SoC 100 may be reduced.

In addition, the power controller 130 adjusts gating of the first clock signal based on the plurality of activity request signals ARS, ARS2, and ARS2, and thus, when the function block needs to access the memory 200 immediately, the SoC 100 may operate without delay.

Figure 2:
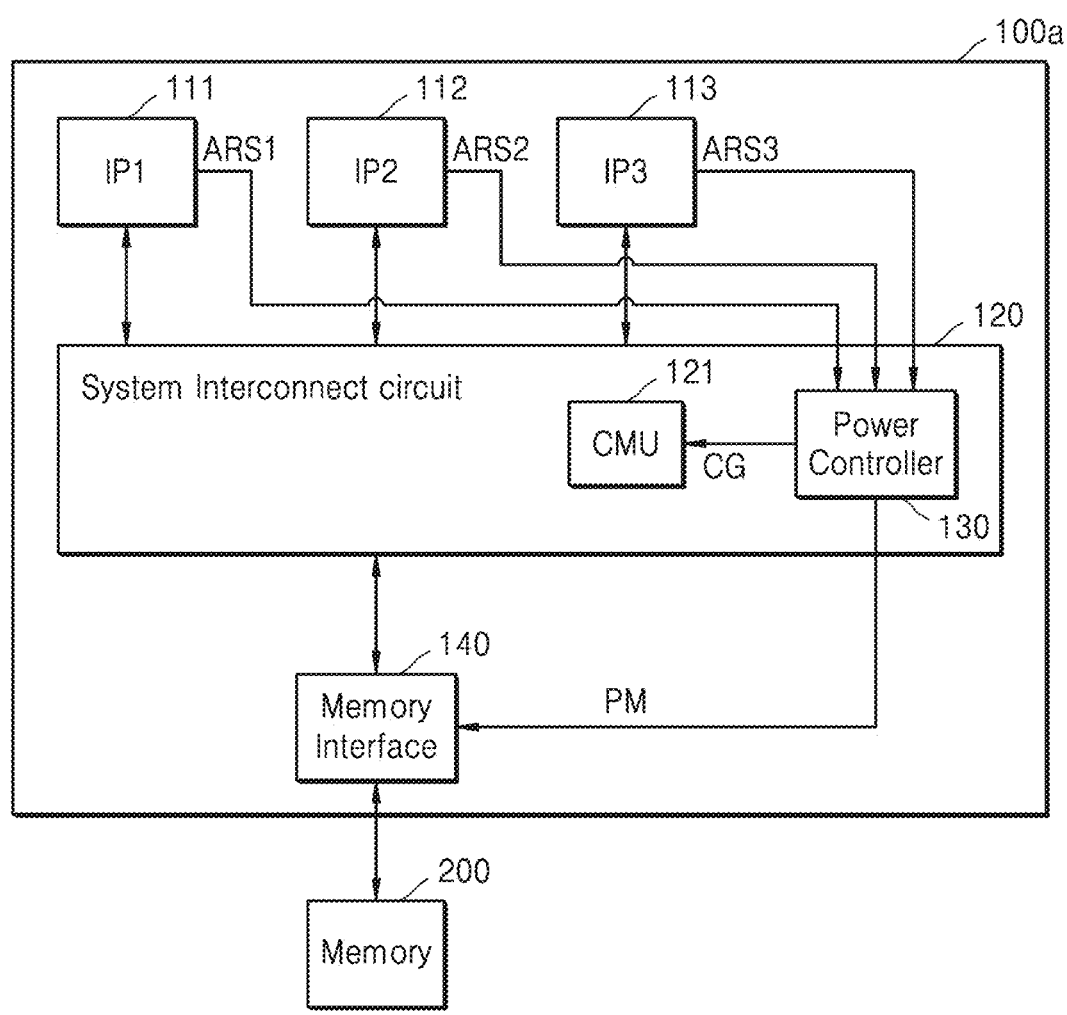
FIG. 2 is a block diagram illustrating a SoC according to an example embodiment of the inventive concepts.

FIG. 2 is a block diagram illustrating a SoC 100a according to an example embodiment of the inventive concepts.

The configuration and function of the SoC 100a of FIG. 2 is similar to those of the SoC 100 of FIG. 1. Therefore, redundant descriptions will be omitted.

In the SoC 100a of FIG. 2, the power controller 130 may be provided in the system interconnect circuit 120. In other words, the power controller 130 and the system interconnect circuit 120 may be implemented as one module.

Figure 3A:
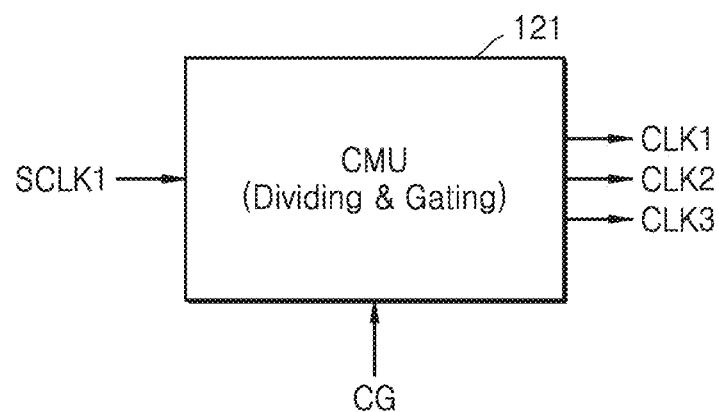
FIGS. 3A and 3B are diagrams illustrating root clock gating according to an example embodiment of the inventive concepts.
Figure 3B:
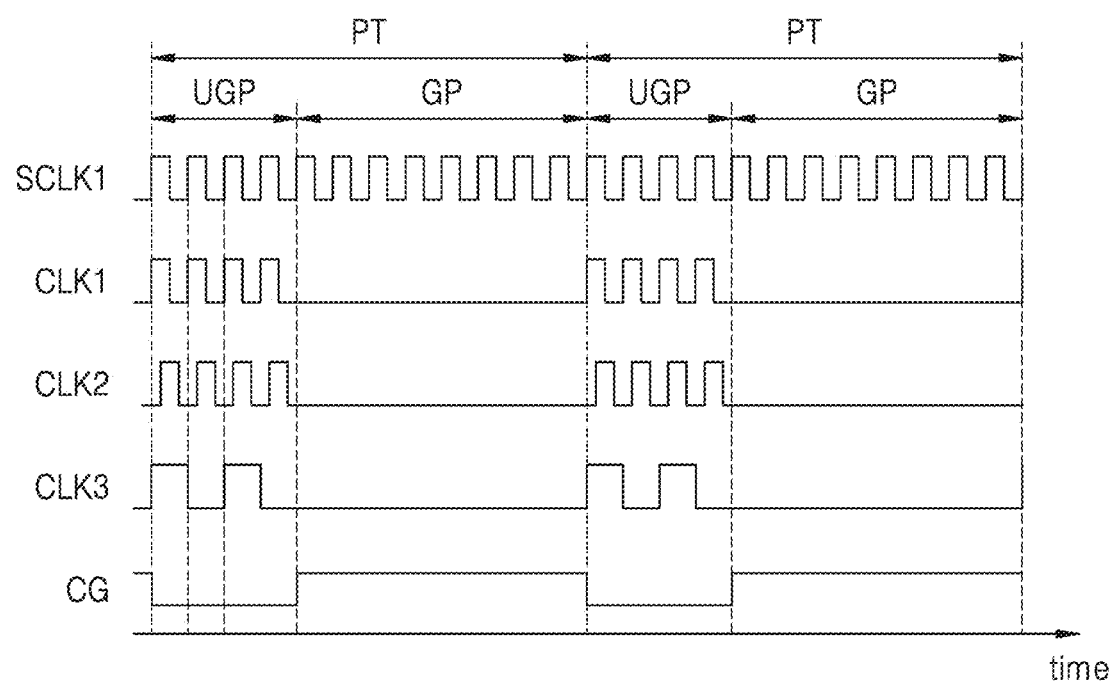

FIGS. 3A and 3B are diagrams illustrating root clock gating according to an example embodiment of the inventive concepts. Root clock gating may be performed by the clock management circuit 121 included in the system interconnect circuit 120 of FIG. 1.

Referring to FIG. 3A, the clock management circuit 121 may receive a source clock signal, that is, a first clock signal SCLK1, and based on the first clock signal SCLK1, may generate a plurality of internal clock signals CLK1, CLK2, and CLK3 and may gate a clock signal. The plurality of internal clock signals CLK1, CLK2, and CLK3 may be used as clock signals of a plurality of IPs included in the system interconnect circuit 120. In FIG. 3A, the three internal clock signals CLK1, CLK2, and CLK3 are illustrated for convenience of explanation, but the inventive concepts are not limited thereto, and the number of plurality of internal clock signals may be varied according to required design specifications.

The clock management circuit 121 may generate the plurality of internal clock signals CLK1, CLK2, and CLK3 by buffering, dividing, or delaying the first clock signal SCLK1. This is described by way of example with reference to a timing diagram of FIG. 3B.

Referring to FIG. 3B, the first clock signal SCLK1 may have a certain frequency. The clock management circuit 121 may generate the first internal clock signal CLK1 by buffering the first clock signal SCLK1. The first internal clock signal CLK1 may have the same frequency and phase as those of the first clock signal SCLK1.

The clock management circuit 121 may generate the second internal clock signal CLK2 by delaying the first clock signal SCLK1. The second internal clock signal CLK2 may have the same frequency as that of the first clock signal SCLK1 and may have a different phase from that of the first clock signal SCLK1. The clock management circuit 121 may generate the third internal clock signal CLK3 by dividing the first clock signal SCLK1. One period of the third internal clock signal CLK3 may be twice one period of the first clock signal CLK3.

A method in which the clock management circuit 121 generates the plurality of internal clock signals based on the first clock signal SCLK1 has been schematically described with reference to FIG. 3B. However, the inventive concepts are not limited thereto, and the clock management circuit 121 may be implemented as a clock tree and may generate internal clock signals having various frequencies and phases.

Continuously, referring to FIG. 3A, the clock management circuit 121 may control gating of the first clock signal SCLK1, that is, root clock gating, based on a clock gating control signal CG.

Referring to FIG. 3B, the clock gating control signal CG may repeat an inactive level (e.g., logic low) and an active level (e.g., logic high) every one cycle PT. When the clock gating control signal CG is in the inactive level, the clock management circuit 121 may ungate the first clock signal SCLK1, and during an ungating period UGP, generate the plurality of internal clock signals CLK1, CLK2, and CLK3. When the clock gating control signal CG is in the active level, the clock management circuit 121 may gate the first clock signal SCLK1. Accordingly, generation of the plurality of internal clock signals CLK1, CLK2, and CLK3 may be blocked during a gating period GP. In an embodiment, the gating period GP may be longer than the ungating period UGP.

Figure 4:
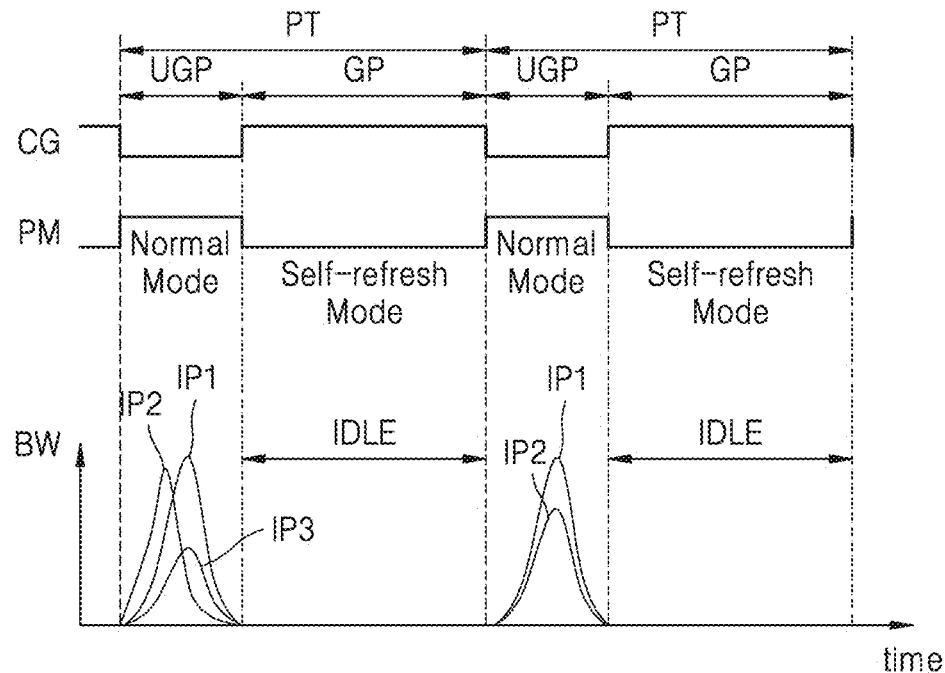
FIG. 4 is a timing diagram illustrating operations of components of a SoC according to root clock gating according to an example embodiment of the inventive concepts.

FIG. 4 is a timing diagram illustrating operations of components of a SoC according to root clock gating according to an example embodiment of the inventive concepts.

Referring to FIG. 4, the power controller 130 may transmit the power mode signal PM for controlling the power of the memory 200 to the memory interface 114 (of FIG. 1), and a power mode of the memory indicated by the power mode signal PM may be varied during the ungating period UGP and the gating period GP.

The power controller 130 may transmit the power mode signal PM indicating a normal mode to the memory interface 140 during the ungating period UGP, and may transmit the power mode signal PM indicating a lower-power mode to the memory interface 140 during the gating period GP. For example, a first level, e.g., logic high, of the power mode signal PM may indicate the normal mode, and a second level, e.g., logic low, may indicate the lower-power mode. The memory 200 may perform a normal operation in the normal mode, and may perform a self-refresh operation in the lower-power mode.

Because the system interconnect circuit 120 operates and the memory 200 normally operates during the ungating period UGP, transactions between the plurality of function blocks 111, 112, and 113 and the memory 200 may be performed.

Because the system interconnect circuit 120 does not operate and the memory 200 operates in the self-refresh mode during the gating period GP, transactions between the plurality of function blocks 111, 112, 113 and the memory 200 may be blocked.

During the ungating period UGP, a plurality of function modules, for example, IP1, IP2, and IP3, or IP1 and IP2, may access the memory 200 and occupy the memory bandwidth BW. Because access to the memory 200 is blocked during the gating period GP, the memory bandwidth BW may be zero and the memory 200 may maintain an IDLE state.

As described above, the power controller 130 (of FIG. 1) may control a first clock signal of the system interconnect circuit 120 to be periodically gated, so that the plurality of functional blocks 111, 112, and 113 may be synchronized to access the memory 200 during the ungating period UGP, and the memory 200 may be in the IDLE state during the gating period GP. As such, the power controller 130 may operate the SoC 100 in a short time unit using a race-to-idle method and control root clock gating so that the memory 200 maintains the idle state for a relatively long time, thereby reducing power consumption of the memory 200 and the SoC 100, and increasing power efficiency. The controller 130 may be referred to as a race-to-idle controller.

Figure 5:
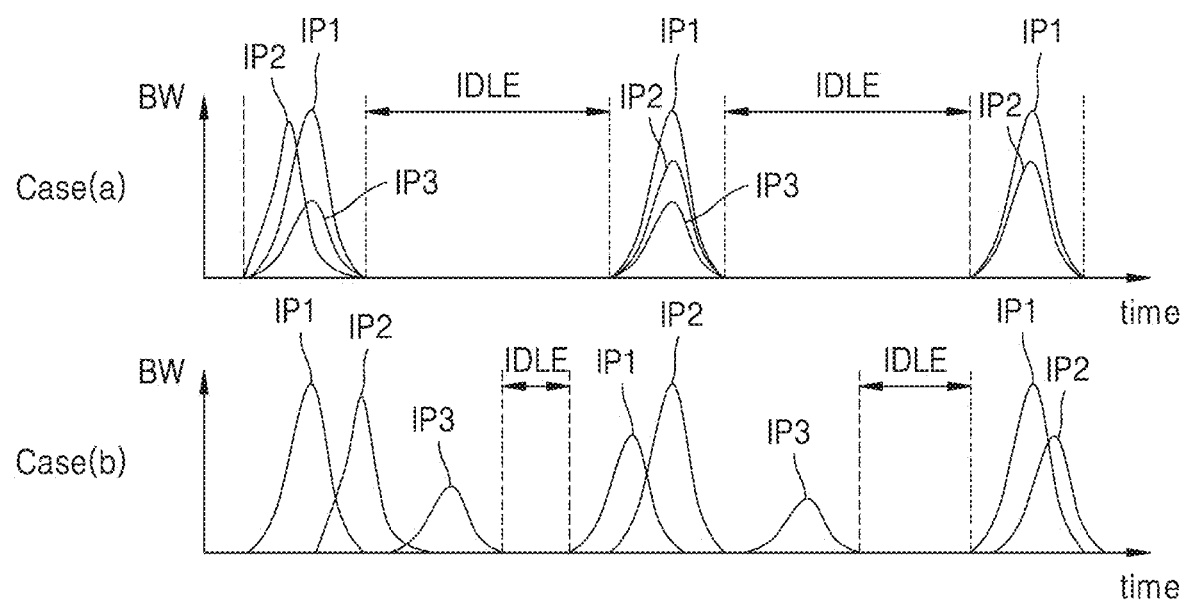
FIG. 5 is a timing diagram illustrating an operation of a memory according to root clock gating according to an example embodiment of the inventive concepts and an operation of a memory according to a comparative example embodiment.

FIG. 5 is a timing diagram illustrating an operation of a memory according to root clock gating according to an example embodiment of the inventive concepts and an operation of a memory according to a comparative example embodiment.

Case(a) shows the operation of the memory according to the root clock gating according to the example embodiment of the inventive concepts, and Case(b) shows the operation of the memory according to the comparative example embodiment.

Referring to FIG. 5, according to the root clock gating according to the example embodiment of the inventive concepts of Case(a), a first clock signal of the system interconnect circuit 120 (of FIG. 1) may be root clock gated at a certain period, and the plurality of function modules, for example, IP1, IP2, and IP3 or IP1 and IP2, may be synchronized to access the memory 200 during an ungating period. The memory 200 may operate for a relatively short ungating period and be in an IDLE state for a relatively long gating period.

According to the comparative example embodiment of Case(b), the plurality of function modules, for example, IP1, IP2, and IP3 or IP1 and IP2, may not be synchronized to operate, and, when a transaction occurs in each of the plurality of function modules, may access the memory 200. As shown in the operation of IP3 as well as when a large amount of transactions occurs, the memory 200 may be accessed immediately even when a small amount of transactions occurs, and thus the memory 200 may not maintain the IDLE state for a long time.

As described with reference to FIG. 5, according to root clock gating according to an example embodiment of the inventive concepts, the memory 200 may maintain the IDLE state for a long time, and thus power consumption of the memory 200, the memory interface 114 (of FIG. 1), and the SoC 100 (of FIG. 1) may be reduced and power efficiency may be increased.

Figure 6:
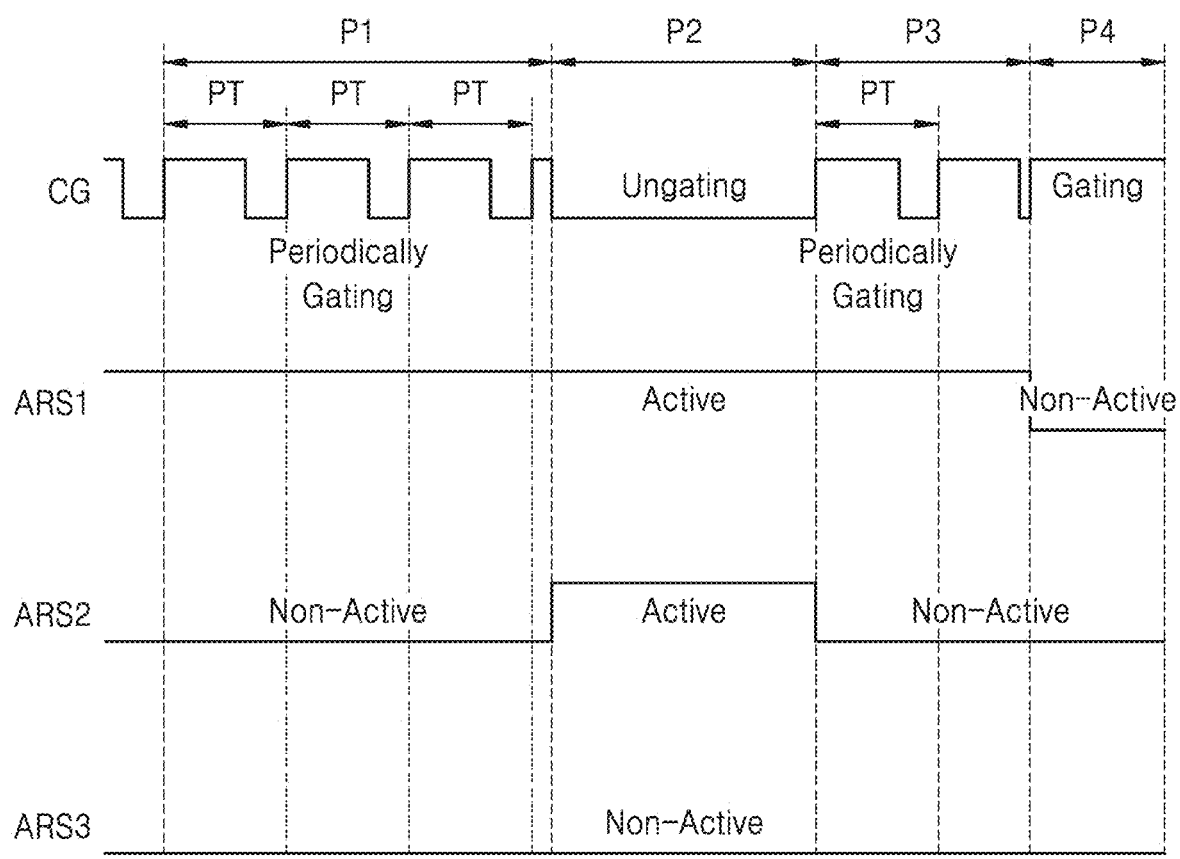
FIG. 6 is a timing diagram illustrating a method, performed by a power controller of an SoC, of generating a clock gating control signal according to an example embodiment of the inventive concepts.

FIG. 6 is a timing diagram illustrating a method, performed by the power controller 130 of the SoC 100, of generating the clock gating control signal CG according to an example embodiment of the inventive concepts.

Referring to FIG. 6, the power controller (130 of FIG. 1) may generate the clock gating control signal CG based on the plurality of activity request signals ARS1, ARS2, and ARS3 received from the plurality of function modules 111, 112, and 113 (of FIG. 1). It is assumed that the activity request signal ARS2 is a first activity request signal received from a function block of high importance.

In a first period P1, the activity request signal ARS1 may have an active level, and the activity request signals ARS2 and ARS3 may have inactive levels. The power controller 130 may generate the clock gating control signal CG that controls to periodically perform root clock gating when at least one activity request signal has the active level and the activity request signal is not the first activity request signal received from the function block of high importance. In the first period P1, the clock gating control signal CG may have the active level and the inactive level every one period PT. The active level of the clock gating control signal CG may indicate gating enable, and the inactive level of the clock gating control signal CG may indicate gating disable. The clock management circuit 121 (of FIG. 1) of the system interconnect circuit 120 (of FIG. 1) may periodically gate a first clock signal based on the clock gating control signal CG in the first period P1. In other words, root clock gating may be performed periodically.

In a second period P2, the activity request signals ARS1 and ARS2 may have active levels, and the activity request signal ARS3 may have the inactive level. The power controller 130 may generate the clock gating control signal CG that controls the first clock signal to be ungated when the first activity request signal, e.g., ARS2, received from the function block of high importance among the activity request signals has the active level. The clock gating control signal CG may have the inactive level, and the clock management circuit 121 may ungate the first clock signal based on the inactive level of the clock gating control signal CG in the second period P2. In other words, the clock management circuit 121 may receive the first clock signal and generate a plurality of internal clock signals based on the first clock signal.

In a third period P3, the activity request signal ARS1 may have the active level, and the activity request signals ARS2 and ARS3 may have the inactive level. An operation of the power controller 130 in the third period P3 is the same as the operation in the first period P1, and thus redundant descriptions will be omitted.

In a fourth period P4, all of the activity request signals ARS1, ARS2, and ARS3 may have inactive levels. When all of the activity request signals ARS1, ARS2, and ARS3 have inactive levels, the power controller 130 may generate the clock gating control signal CG that controls the first clock signal to be gated. The clock gating control signal CG may have the active level, and the clock management circuit 121 may gate the first clock signal based on the active level of the clock gating control signal CG in the fourth period P4.

Figure 7:
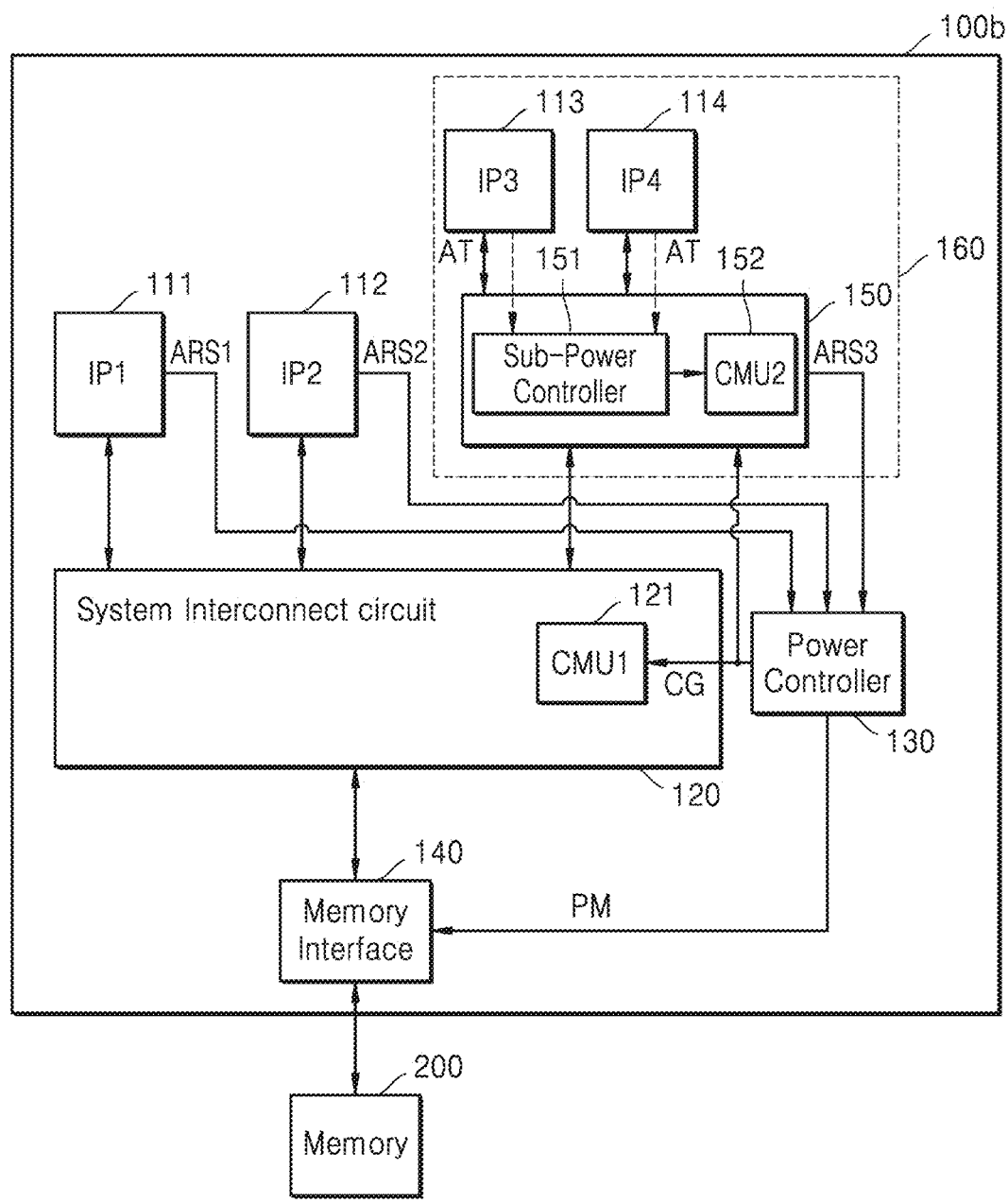
FIG. 7 is a block diagram illustrating a SoC according to an example embodiment of the inventive concepts.

FIG. 7 is a block diagram illustrating a SoC 100b according to an example embodiment of the inventive concepts.

Referring to FIG. 7, the SoC 100b may include the plurality of function blocks 111, 112, 113 and 114, the system interconnect circuit 120, the power controller 130, a sub-interconnect circuit 150 and the memory interface 140. The SoC 100b of FIG. 7 is a modified example of the SoC 100 of FIG. 1. Accordingly, redundant descriptions are omitted and differences are mainly described.

The sub-interconnect circuit 150 may connect at least two function blocks for example, the third and fourth function blocks 113 and 114, among the plurality of function blocks 111, 112, 113 and 114, and the system interconnect circuit 120. The sub-internet circuit 150 and the at least two function blocks 113 and 114 may be referred to as a subsystem 160.

The sub-interconnect circuit 150 may include a power controller 151 and a clock management circuit 152. The sub-interconnect circuit 150 is referred to as a sub-power controller 151 so as to distinguish the power controller 151 from the power controller 130 of the SoC 100b. In addition, in order to distinguish the clock management circuit 121 included in the system interconnect circuit 120 and the clock management circuit 152 included in the sub-interconnect circuit 150, the clock management circuit 121 provided in the system interconnect circuit 120 is referred to as a first clock management circuit (CMU1) 121, and the clock management circuit 152 included in the sub-interconnect circuit 150 is referred to as a second clock management circuit (CMU2) 142. The sub-interconnect circuit 150 and the subsystem 160 are described in more detail with reference to FIG. 8.

Figure 8:
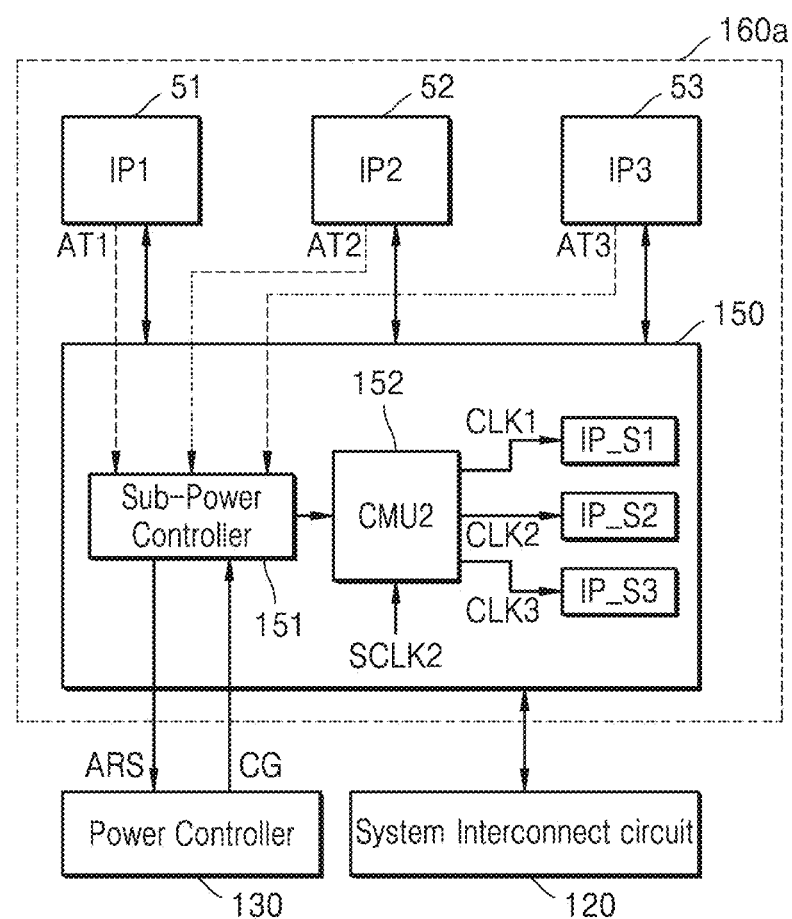
FIG. 8 is a block diagram illustrating a subsystem according to an example embodiment of the inventive concepts.

FIG. 8 is a block diagram illustrating a subsystem 160a according to an example embodiment of the inventive concepts. The subsystem 160a of FIG. 8 may be applied to the subsystem 160 of FIG. 7.

Referring to FIG. 8, the subsystem 160a may include the sub-interconnect circuit 150 and a plurality of function blocks 51, 52, and 53 (e.g., IP1, IP2, and IP3). The sub-interconnect circuit 150 may include the sub-power controller 151, the second clock management circuit 152, and a plurality of IPs, for example, IP_S1, IP_S2, and IP_S3.

The sub-power controller 151 may receive state signals AT1, AT2, and AT3 from the plurality of function blocks 51, 52, and 53, respectively, generate the activity request signal ARS based on the plurality of state signals AT1, AT2, and AT3, and transmit the activity request signal ARS to the power controller 130.

A state signal indicates a state of the corresponding function block. For example, when the function block is in an active state or the memory 200 is to be accessed, the state signal may have an active level. The sub-power controller 151 may ignore a state signal received from a function block that is set to have low importance among the plurality of state signals AT1, AT2, and AT3, and generate the activity request signal ARS based on at least one other state signal.

For example, when the first function block 51 is a function block of low importance, the sub-power controller 151 may ignore the first state signal AT1, and generate the activity request signal ARS based on the second state signal AT2 and the third state signal AT3. In an embodiment, the sub-power controller 151 may generate the activity request signal ARS by performing an OR operation on the second state signal AT2 and the third state signal AT3.

For example, the sub-power controller 151 may generate the activity request signal ARS having an active level when at least one of the second state signal AT2 and the third state signal AT3 is in the active level, for example, logic high, and generate the activity request signal ARS having an inactive level when both the second state signal AT2 and the third state signal AT3 are in the inactive level, for example, logic low.

As described above, the sub-power controller 151 may generate the activity request signal ARS by filtering the state signals AT1, AT2, and AT3.

In addition, the sub-power controller 151 may receive the clock gating control signal CG from the power controller 130 and control root clock gating of the second clock management circuit 152 based on the clock gating control signal CG.

The operation of the second clock management circuit 152 is similar to the operation of the first clock management circuit 141 of FIG. 7. The second clock management circuit 152 may generate the plurality of internal clock signals, for example, CLK1, CLK2, and CLK3, based on a source clock signal, for example, the second clock signal SCLK2, and provide the plurality of internal clock signals to the plurality of IPs IP_S1, IP_S2, and IP_S3. The plurality of IPs IP_S1, IP_S2, and IP_S3 may operate based on a received internal clock signal. The second clock signal SCLK2 may be the same as or different from a source clock signal of a system interconnect circuit, for example, the first clock signal SCLK1.

In an embodiment, the sub-power controller 151 may transmit the clock gating control signal CG to the second clock management circuit 152, and the second clock management circuit 152 may control root clock gating of the second clock signal SCLK2 based on the clock gating control signal CG.

In an embodiment, the sub-power controller 151 may generate an internal gating control signal based on the clock gating control signal CG and the plurality of state signals AT1, AT2, and AT3, and the second clock management circuit 152 may control root clock gating of the second clock signal SCLK2 based on the internal gating control signal. For example, even when the sub-power controller 151 receives the clock gating control signal CG indicating gating enable, when a previously set state signal among the plurality of state signals AT1, AT2, and AT3 has the active level, the sub-power controller 151 may generate an internal gating control signal indicating gating disable. The second clock management circuit 152 may ungate the second clock signal SCLK2 based on the internal gating control signal.

As described above, the sub-interconnect circuit 150 and the sub-power controller 151 may operate similarly to the system interconnect circuit 120 (FIG. 7) and the power controller 130, respectively, and the source clock signal of the sub-interconnect circuit 150, for example, the second clock signal SCLK2, may be root clock gated based on the clock gating control signal CG.

Figure 9:
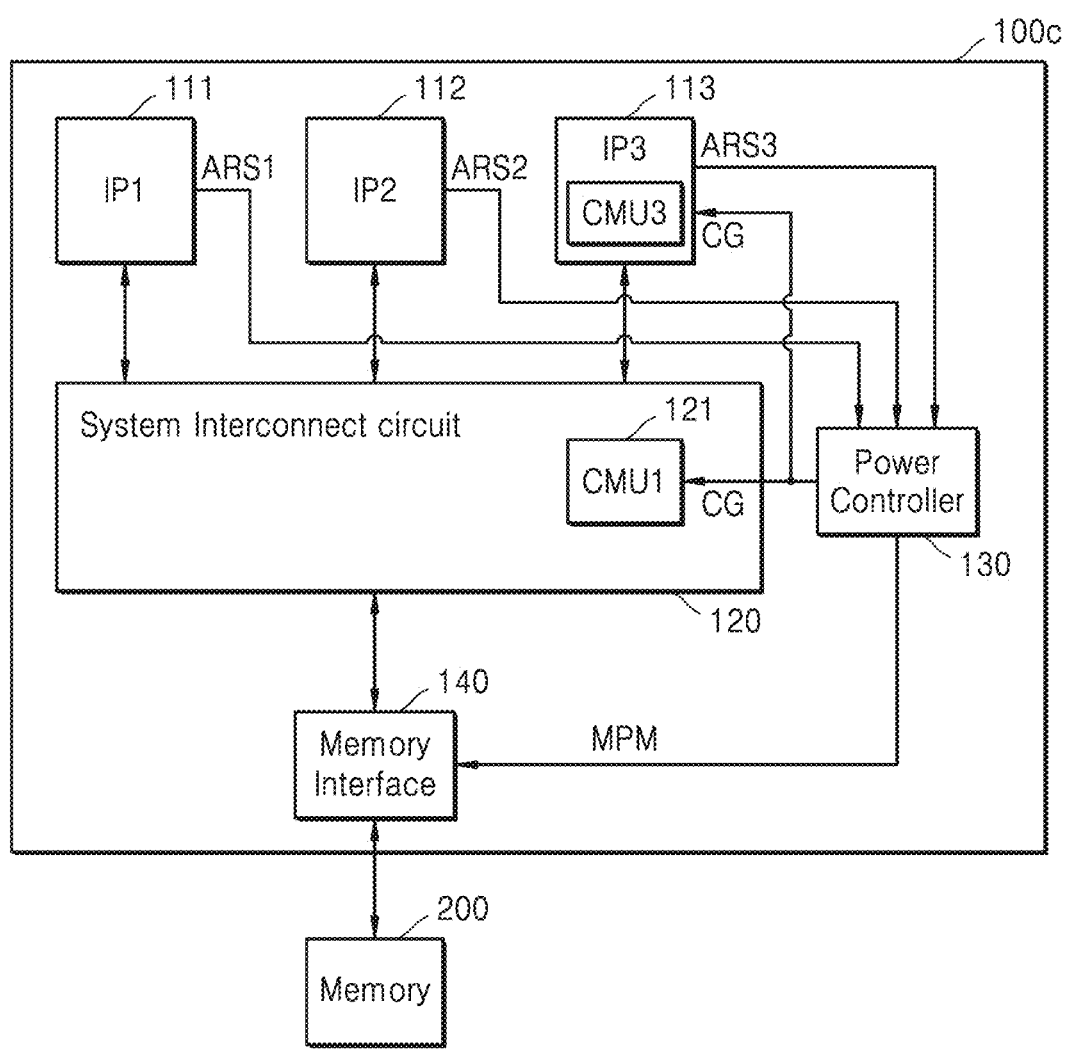
FIG. 9 is a block diagram illustrating a SoC according to an example embodiment of the inventive concepts.

FIG. 9 is a block diagram illustrating a SoC 100c according to an example embodiment of the inventive concepts.

Referring to FIG. 9, the SoC 100c may include the plurality of function blocks 111, 112, and 113, the system interconnect circuit 120, the power controller 130, and the memory interface 140. Each of the system interconnect circuit 120, the power controller 130, and the memory interface 140 may also be one of the function blocks of the SoC 100. The configuration and operation of the SoC 100c of FIG. 9 is similar to those of the SoC 100 of FIG. 1. Accordingly, redundant descriptions are omitted and differences are mainly described.

Referring to FIG. 9, at least one function module among the plurality of function blocks 111, 112, and 113, for example, the third function module 113, may include a clock management circuit (CMU3) 21, and the clock management circuit 21 may receive the clock gating control signal CG from the power controller 130 and perform root clock gating based on the clock gating control signal CG. In order to distinguish the clock management circuit 21 from the clock management circuit 121 included in the system interconnect circuit 120, the clock management circuit 121 included in the system interconnect circuit 120 is referred to as the CMU1 121, and the clock management circuit 21 is referred to as the third clock management circuit (CMU3) 21.

Figure 10A:
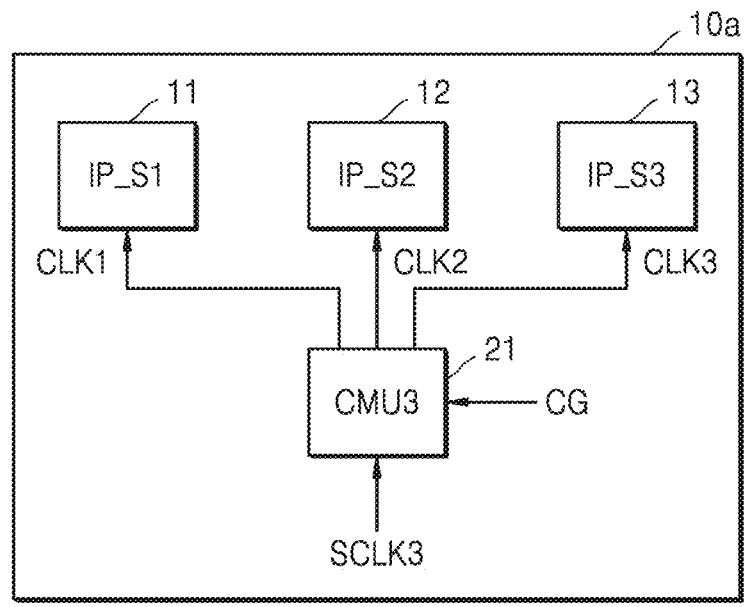
FIGS. 10A, 10B, and 10C are block diagrams illustrating implementations of three function blocks of FIG. 9.
Figure 10B:
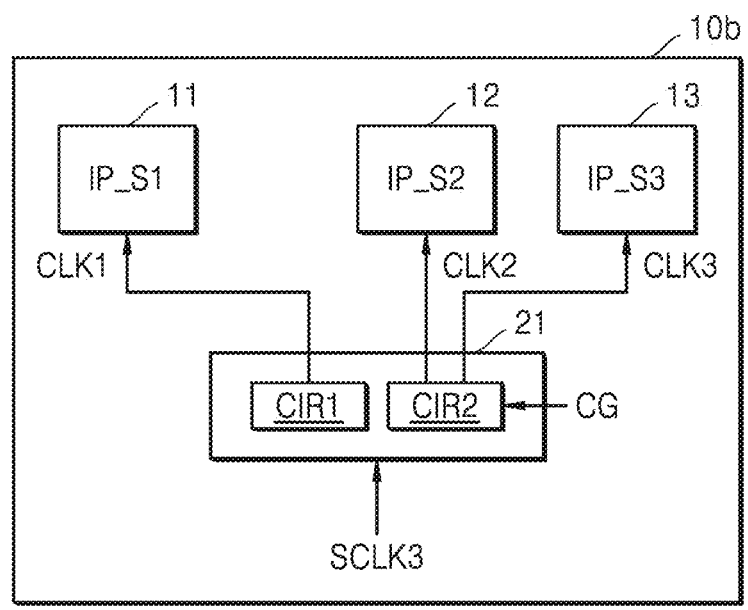
Figure 10C:
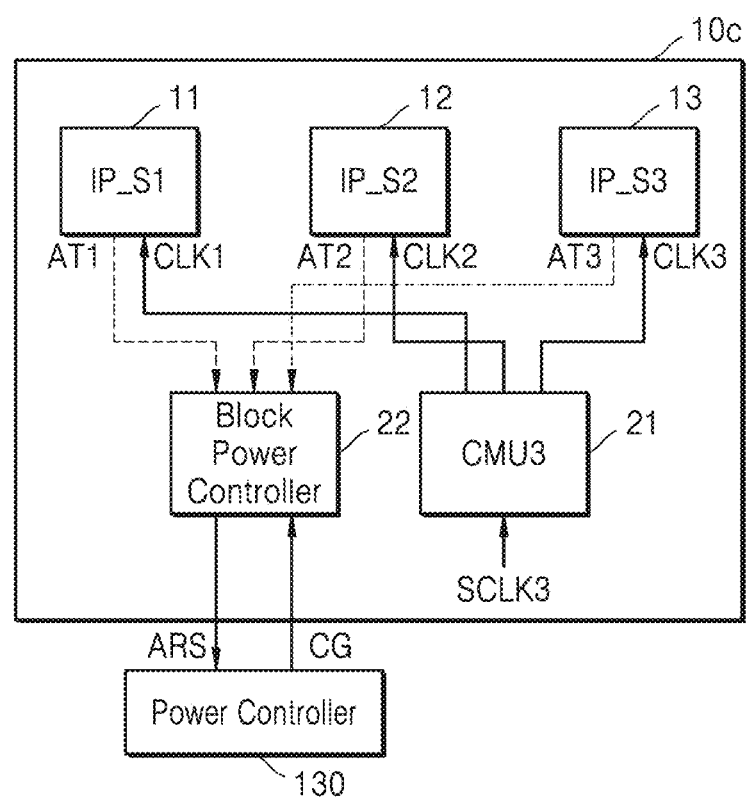

FIGS. 10A, 10B, and 10C are block diagrams illustrating implementations of three function blocks 10a, 10b, and 10c of FIG. 9.

Referring to FIG. 10A, the function block 10a may include the third clock management circuit 21 and plurality of IPs 11, 12, and 13 (for example, IP_S1, IP_S2, and IP_S3).

The third clock management circuit 21 may generate the plurality of internal clock signals CLK1, CLK2 and CLK3 based on a source clock signal, for example, the third clock signal SCLK3, and provide the plurality of internal clock signals CLK1, CLK2, and CLK3 to the plurality of IPs 11, 12, and 13. The plurality of IPs 11, 12, and 13 may operate based on a received internal clock signal.

The third clock management circuit 21 may gate or ungate the third clock signal based on the clock gating control signal CG received from the power controller 130. In other words, the third clock management circuit 21 may perform root clock gating based on the clock gating control signal CG.

In an embodiment, the operation of the function block 10a may essentially require access to the memory 200. The function block 10a may gate the third clock signal SCLK3, which is the source clock signal, during a period in which access to the memory 200 is blocked, that is, during the gating period in which the clock gating control signal CG has a gating enable level to stop operating, and ungate the third clock signal SCLK3 during the ungating period to operate by generating the plurality of internal clock signals CLK1, CLK2, and CLK3 based on the third clock signal SCLK3.

Referring to FIG. 10B, the third clock management circuit 21 may include a first circuit CIR1 and a second circuit CIR2, and the first circuit CIR1 may generate the first internal clock CLK1 based on the third clock signal SCLK3 and provide the first internal clock CLK1 to the IP_S1 11. The second circuit CIR2 may generate the second internal clock CLK2 and the third internal clock CLK3 based on the third clock signal SCLK3, and provide the second internal clock CLK2 and the third internal clock CLK3 to the IP_S2 12 and the IP_S3 13, respectively.

The operations of the IP_S2 12 and the IP_S3 13 may essentially require access to the memory 200. The second circuit CIR2 may gate the third clock signal SCLK3 during a period in which access to the memory 200 is blocked, that is, during the gating period in which the clock gating control signal CG has a gating enable level, thereby blocking the operations of the IP_S2 12 and the IP_S3 13. In addition, the second circuit CIR2 may ungate the third clock signal SCLK3 during the ungating period so that the operations of the IP_S2 12 and the IP_S3 13 may operate.

Meanwhile, the operation of the IP_S1 11 may be performed regardless of access to the memory 200. Accordingly, even though the second circuit CIR2 gates the third clock signal SCLK3 based on the clock gating control signal CG, the first circuit CIR1 may generate the first internal clock signal CLK1 based on the third clock signal SCLK3 so that the IP_S1 11 may operate.

Referring to FIG. 10C, the function block 10c may further include a block power controller 22. The operation of the block power controller 22 is similar to the operation of the power controller 151 included in the sub-interconnect circuit 150 of FIG. 8. The block power controller 22 may receive the state signals AT1, AT2, and AT3 from the plurality of IPs 11, 12, and 13, respectively, generate the activity request signal ARS based on the plurality of state signals AT1, AT2, and AT3, and transmit the activity request signal ARS to the power controller 130.

A state signal indicates a state of the corresponding IP. For example, when the IP is in an active state or the IP attempts to access the memory 200, the state signal may have an active level. The block power controller 22 may ignore a state signal received from an IP that is set to have low importance among the plurality of state signals AT1, AT2, and AT3, and generate the activity request signal ARS based on at least one other state signal. The block power controller 22 may generate the activity request signal ARS by performing an OR operation on a plurality of other state signals.

In addition, the block power controller 22 may receive the clock gating control signal CG from the power controller 130 and control root clock gating of the third clock management circuit 21 based on the clock gating control signal CG. Descriptions related to root gating control of the sub-power controller 151 may be applied to root clock gating control of the block power controller 22. Therefore, detailed descriptions thereof are omitted.

Figure 11:
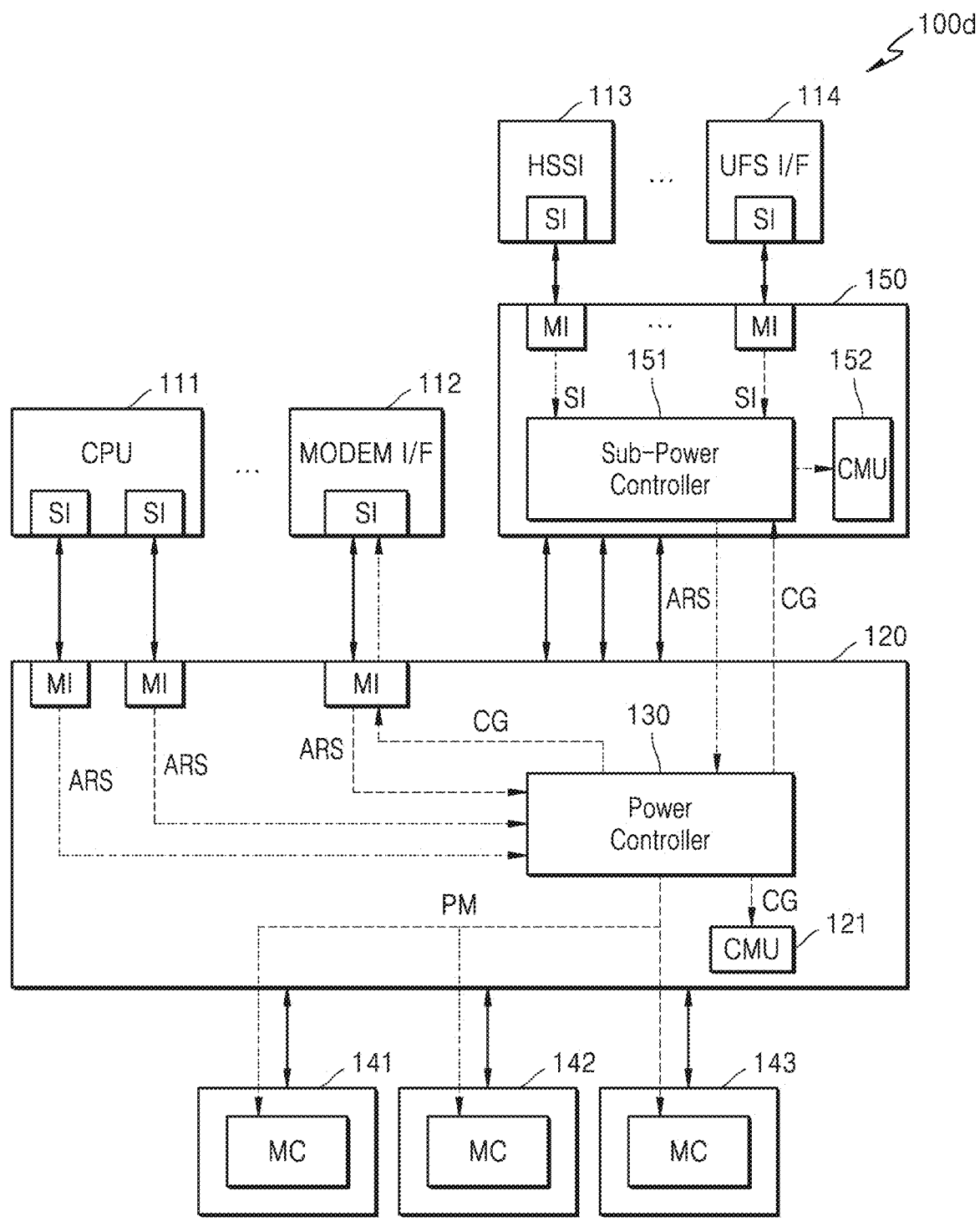
FIG. 11 is a block diagram illustrating an implementation example of a SoC according to an example embodiment of the inventive concepts.

FIG. 11 is a block diagram illustrating an implementation example of a SoC 100d according to an example embodiment of the inventive concepts. The configurations and operations of the above-described SoC 100, 100a, 100b, and 100c may be applied to the SoC 100d of FIG. 11.

Referring to FIG. 11, the SoC 100d may include the plurality of function blocks 111, 112, 113 and 114, the system interconnect circuit 120, the sub-interconnect circuit 150, and a plurality of memory interfaces 141, 142, and 143.

The plurality of function blocks 111, 112, 113, and 114 may include, as non-limiting examples, a CPU, a modem interface, a high-speed serial interface (HSSI), a universal flash storage (UFS) interface, etc. Each of the plurality of function blocks 111, 112, 113 and 114 may include an interface, for example, a slave interface SI. In an embodiment, at least one function block, for example, the first function block 111, may include a plurality of interfaces. The plurality of function blocks 111, 112, 113, and 114 may transmit/receive data and/or signals to and from the system interconnect circuit 120 or the sub-interconnect circuit 150 through an interface.

The system interconnect circuit 120 may include the power controller 130 and the clock management circuit 121 (also referred to as a clock management unit (CMU)). The system interconnect circuit 120 may further include a plurality of interfaces, for example, a plurality of master interfaces (MIs), and may further include various IPs for the operation of the system interconnect circuit 120.

The sub-interconnect circuit 150 may include a sub-power controller 151 and a CMU 152. In addition, the sub-interconnect circuit 150 may further include a plurality of interfaces, for example, a plurality of MIs, and may further include various IPs for operation of the sub-interconnect circuit 150.

Each of the plurality of memory interfaces 141, 142, and 143 may include a memory controller MC and may be connected to a memory.

A plurality of function blocks connected to the system interconnect circuit 120, for example, the first function block 111 and the second function block 112, may transmit the activity request signal ARS corresponding to each state to the power controller 130. In an embodiment, the activity request signal ARS may be transmitted to the power controller 130 through an interface, for example, an SI and an MI. However, the inventive concepts are not limited thereto, and the activity request signal ARS may be transmitted to the power controller 130 through a separately provided channel.

The sub-power controller 151 may receive the state signals AT from at least two function blocks connected to the sub-interconnect circuit 150, for example, the third function block 113 and the fourth function block 114, filter the state signals AT, and generate the activity request signal ARS. The sub-power controller 151 may transmit the activity request signal ARS to the power controller 130.

The power controller 130 may receive the plurality of activity request signals ARS from the plurality of function blocks 111, 112, 113 and 114 or the sub-interconnect circuit 150, and control the plurality of function blocks 111, 112, 113, and 114 to be synchronized to operate based on the plurality of activity request signals ARS. In other words, the power controller 130 may control the plurality of function blocks 111, 112, 113, and 114 to periodically and simultaneously access the memory through the plurality of memory interfaces 141, 142, and 143. Also, the power controller 130 may control the memory to operate in an IDLE state, for example, in a self-refresh mode during a period in which the plurality of function blocks 111, 112, 113, and 114 do not operate.

As described above, the power controller 130 may generate the clock gating control signal CG based on the plurality of activity request signals ARS and provide the clock gating control signal CG to the clock management circuit 121. The clock management circuit 121 may perform root clock gating based on the clock gating control signal CG.

The power controller 130 may transmit the clock gating control signal CG to the sub-power controller 151 provided in the sub-interconnect circuit 150 and/or at least one function block, for example, the second function block 112. The sub-power controller 151 may provide the clock gating control signal CG or an internal gating second signal generated based on the clock gating control signal CG to the clock management circuit 151, and the clock management circuit 151 may perform root clock gating based on the gating control signal CG or the internal gating control signal. The second function block 112 may also perform root clock gating on a source clock signal used inside based on the clock gating control signal CG.

The system interconnect circuit 120 may provide a data transmission path so that the plurality of function blocks 111, 112, 113, and 114 access the memory during the ungating period, block access of the plurality of function blocks 111, 112, 113, and 114 to the memory, and control the memory to operate in the IDLE state during the gating period. In addition, some of the function blocks 111, 112, 113, and 114 may not operate during the gating period by performing root clock gating on the source clock signal used inside based on the clock gating control signal CG.

Figure 12:
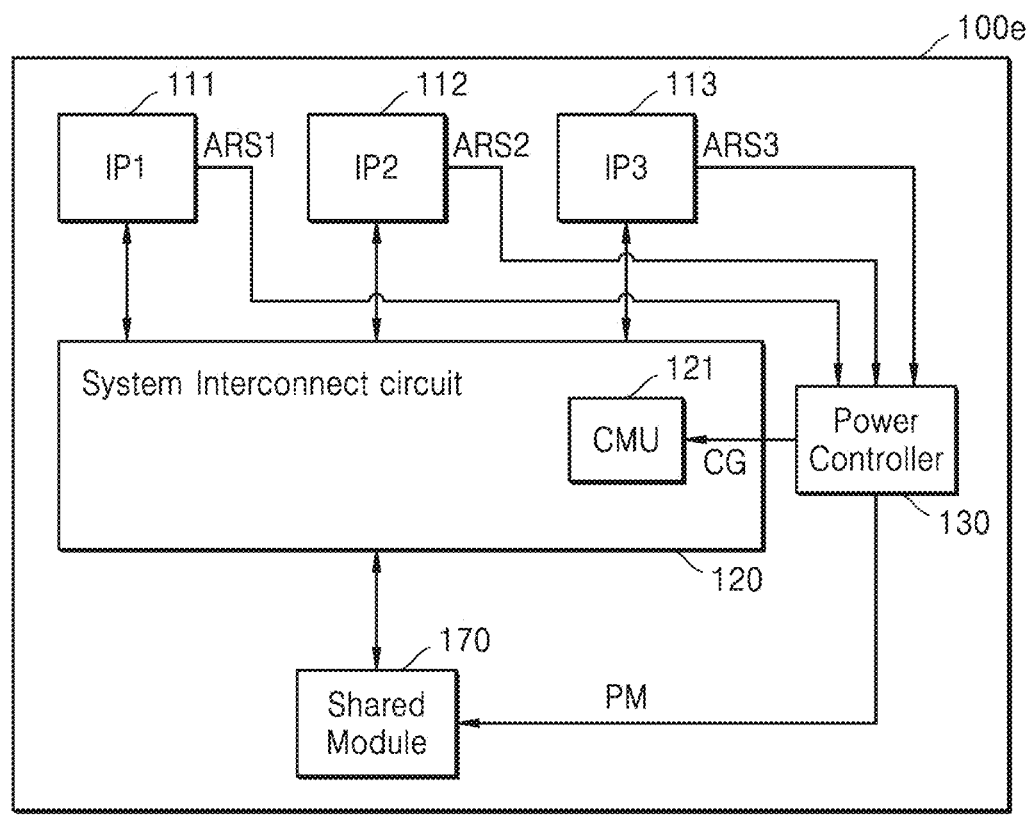
FIG. 12 is a block diagram illustrating a SoC according to an example embodiment of the inventive concepts.

FIG. 12 is a block diagram illustrating a SoC 100e according to an example embodiment of the inventive concepts.

Referring to FIG. 12, the SoC 100e may include the plurality of function blocks 111, 112, and 113, the system interconnect circuit 120, the power controller 130, and a shared module 170.

The shared module 170 may be a resource shared by the plurality of function blocks 111, 112, and 113. In other words, the plurality of function blocks 111, 112, 113 may access the shared module 170 through the system interconnect circuit 120. For example, the shared module 170 may be a shared SRAM. The plurality of function blocks 111, 112, and 113 may be a master module, and the shared module 170 may be a slave module.

As described above, the power controller 130 may generate the clock gating control signal CG based on the plurality of activity request signals ARS1, ARS2 and ARS3 received from the plurality of function blocks 111, 112, and 113, respectively, and provide the clock gating control signal CG to the clock management circuit 121, and the clock management circuit 121 may gate and ungate a source clock signal, for example, a first clock signal, used in the system interconnect circuit 120 based on the clock gating control signal CG. The first clock signal may be gated periodically, and in certain cases, may be continuously gated or continuously ungated.

The power controller 130 may provide the power mode signal PM for controlling a power mode to the shared module 170, and the power mode signal PM may indicate a lower-power mode during a gating period of the first clock signal and a normal mode during an ungating period of the first clock signal. When the shared module 170 is set to the lower-power mode in response to the power mode signal PM, the shared module 170 may enter an IDLE state, a sleep state, or a power off state. The shared module 170 may be switched from the lower-power mode to the normal mode when the power mode signal PM indicates the normal mode.

Figure 13:
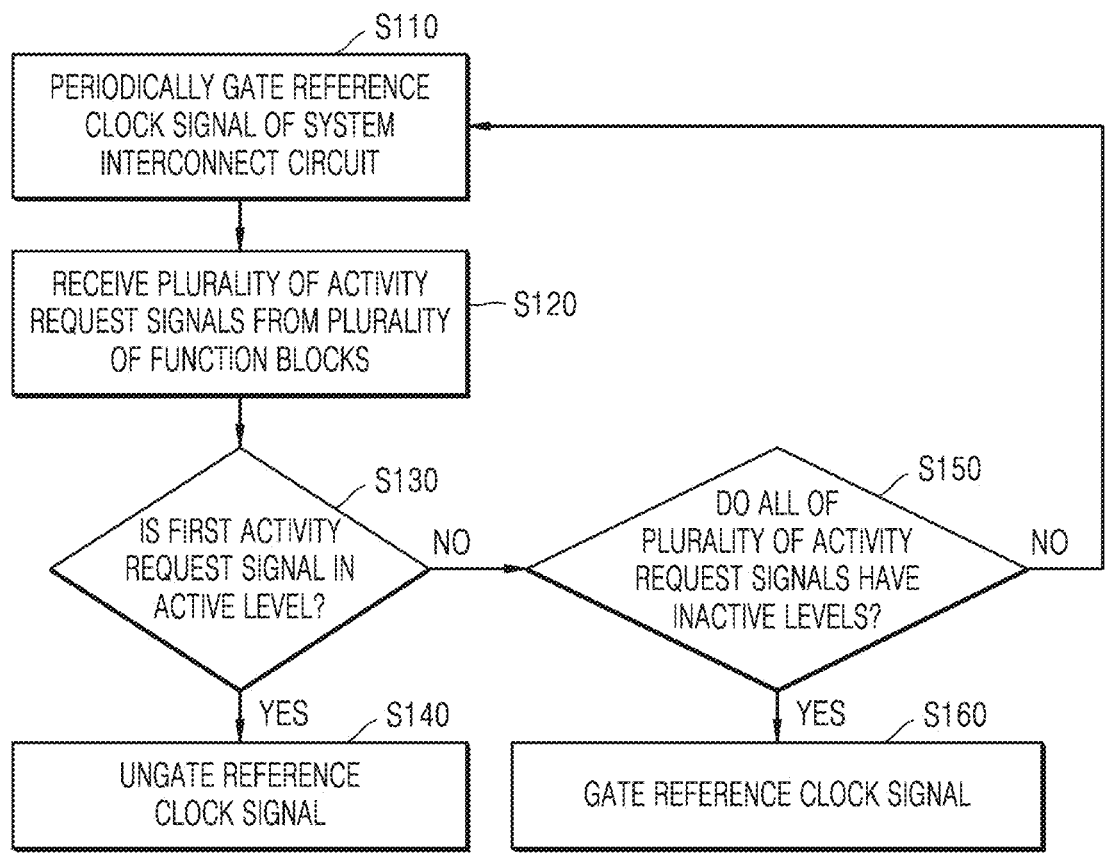
FIGS. 13 and 14 are flowcharts illustrating a root clock gating control method performed by a SoC according to an example embodiment of the inventive concepts.
Figure 14:
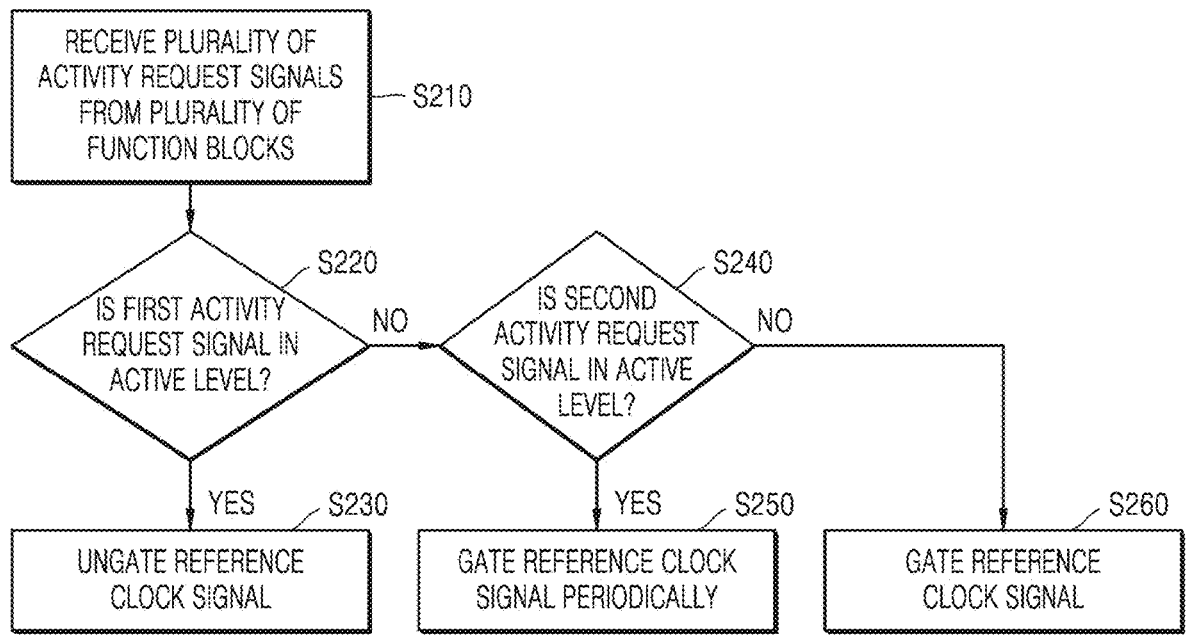

FIGS. 13 and 14 are flowcharts illustrating a root clock gating control method performed by a SoC according to example embodiments of the inventive concepts. The method of FIGS. 13 and 14 is performed by the power controller 130 of the SoC 100, 100a, 100b, 100c, 100d, 100e of FIGS. 1, 2, 7, 9, 11 and 12.

Referring to FIG. 13, the power controller 130 may periodically gate a reference clock signal of a system interconnect circuit (operation S110). When the reference clock signal is gated, the system interconnect circuit does not operate. In the inventive concepts, the power controller 130 gating or ungating the reference clock signal means generating a clock gating control signal that controls the reference clock signal to be gated or ungated.

The power controller 130 may receive a plurality of activity request signals from a plurality of function blocks (operation S120). The activity request signal may indicate a state of the corresponding function block, for example, whether the corresponding function block is in a state in which a memory needs to be accessed.

The power controller 130 may determine whether a first activity request signal among the plurality of activity request signals is in an active level (operation S130). The first activity request signal means an activity request signal received from a function block of high importance among the plurality of function blocks. Here, the function block of high importance may include a function block (e.g., a modem) that needs to access the memory in real time, and/or a function module (e.g., a CPU) of the highest operating performance among the plurality of function blocks. Alternatively, the function block of high importance may be a function block including a data queue, and the function block including the data queue may generate the first activity request signal of the active level when the data queue is in a full state or an empty state.

When the first activity request signal is in the active level, the power controller 130 may ungate the reference clock signal (operation S140). In other words, the power controller 130 may operate the system interconnect circuit to control a plurality of function modules to access the memory (or a shared resource of the plurality of function modules).

When the first activity request signal is not in the active level, the power controller 130 may determine whether all of the plurality of activity request signals have inactive levels (operation S150). When all of the plurality of activity request signals have inactive levels, the power controller 130 may gate the reference clock signal (operation S160). All of the plurality of activity request signals having inactive levels means that the plurality of function blocks do not operate, that is, do not request access to the memory. Accordingly, the power controller 130 may gate the reference clock signal to block an operation of the system interconnect circuit, and control the memory to enter an IDLE state.

The power controller 130 may periodically gate the reference clock signal when all of the plurality of activity request signals do not have inactive levels, that is, when at least some of the plurality of activity request signals have active levels (operation S110).

Referring to FIG. 14, the power controller 130 may receive the plurality of activity request signals from the plurality of function blocks (operation S210). The power controller 130 may control gating of the reference clock signal (e.g., the first clock signal) of the system interconnect circuit based on the plurality of activity request signals.

The power controller 130 may determine whether the first activity request signal among the plurality of activity request signals is in the active level (operation S220). When the first activity request signal is in the active level, the power controller 130 may ungate the reference clock signal because the system interconnect circuit needs to operate (operation S230).

When it is determined that the first activity request signal is not in the active level, the power controller 130 may determine whether a second activity request signal is in the active level (operation S240). The second activity request signal means an activity request signal excluding the first activity request signal from among the plurality of activity request signals. The power controller 130 may determine whether at least one of the plurality of activity request signals is in the active level. When it is determined that the second activity request signal is in the active level, that is, when at least one activity request signal is in the active level, the power controller 130 may periodically gate the reference clock signal (operation S250). The system interconnect circuit may operate periodically, and accordingly, the memory may also be accessed periodically.

The power controller 130 may gate the reference clock signal when it is determined that all of the plurality of activity request signals are in the inactive level (operation S260). As the reference clock signal is gated, the system interconnect circuit does not work, and the memory may maintain the IDLE state.

Figure 15:
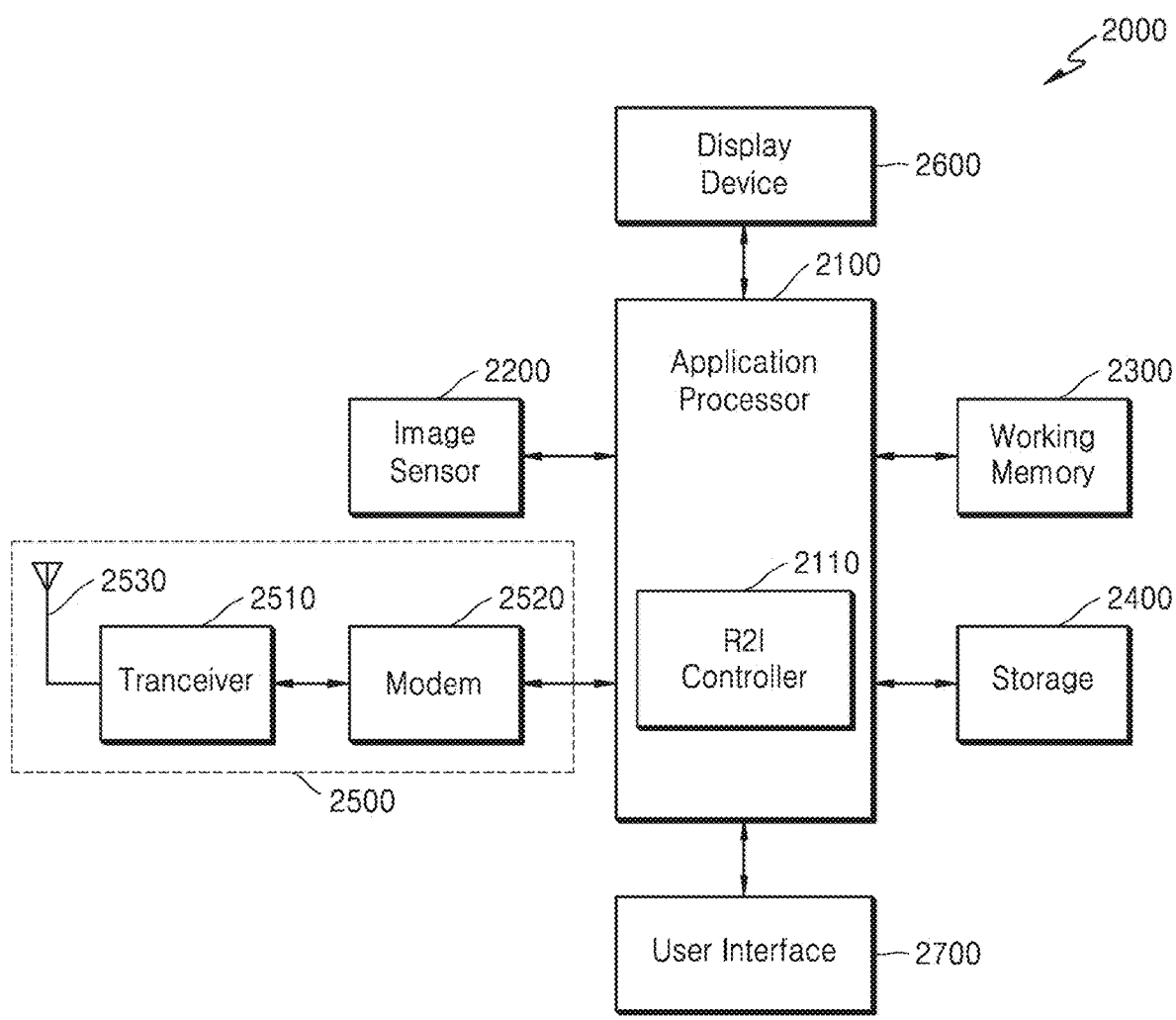
FIG. 15 is a block diagram illustrating an electronic device including an application processor according to an example embodiment of the inventive concepts.

FIG. 15 is a block diagram illustrating an electronic device 2000 including an application processor 2100 according to an example embodiment of the inventive concepts. The electronic device 2000 of FIG. 15 may be a portable terminal.

Referring to FIG. 15, the electronic device 2000 may include the application processor 2100, an image sensor 2200, a display device 2600, a working memory 2300, a storage 2400, a user interface 2700, and a wireless transceiver 2500.

The application processor 2100 may be a main processor of the electronic device 2000, and may be implemented as a SoC that controls the overall operation of the electronic device 2000 and drives an application program, an operating system, etc. The application processor 2100 may provide image data provided from the image sensor 2200 to the display device 2600 or store the image data in the storage 2400. The above-described SoC may be applied as the application processor 2100.

The application processor 2100 may include a race-to-idle controller (R2I controller) 2110. The operations of the power controller 130 and the power controller 130 described with reference to FIGS. 1 to 14 may be applied to the race-to-idle controller 2110.

A plurality of function blocks included in the application processor 2100 may access a shared resource, for example, the working memory 2300, through a system interconnect circuit.

The race-to-idle controller 2110 may control root clock gating of a reference clock signal of the system interconnect circuit. The reference clock signal may be periodically gated, and the plurality of function blocks access the shared resource during an ungating period, and thus the plurality of function blocks may be synchronized to access the shared resource for a short period of time. The shared resource may maintain a low power state, such as an Idle state, during a gating period. Accordingly, power consumption of the application processor 2100 may be reduced.

The working memory 2300 may be implemented as a volatile memory such as a dynamic random access memory (DRAM) or a static RAM (SRAM), or a nonvolatile resistive memory such as a phase change RAM (PRAM) or a resistive RAM (ReRAM). An operating program or an application program stored in the storage 2400 may be loaded into the working memory 2300 and executed. Also, data generated during the operation of the electronic device 2000 may be temporarily stored in the working memory 2300. In an embodiment, the working memory 2300 may operate during a period in which the reference clock signal of the system interconnect circuit is ungated, and maintain an IDLE state during a period in which the reference clock signal of the system interconnect circuit is gated.

The storage 2400 may be implemented as a non-volatile memory device such as NADN flash or resistive memory, and for example, the storage 2400 may be provided as a memory card (MMC, eMMC, SD, and micro SD), etc. The storage 2400 may store the image data provided from the image sensor 2200. Also, the storage 2400 may store an operation program, an application program, etc. of the electronic device 2000.

The user interface 2600 may be implemented as various devices capable of receiving a user input, such as a keyboard, a curtain key panel, a touch panel, a fingerprint sensor, a microphone, etc. The user interface 2700 may receive the user input and provide a signal corresponding to the received user input to an application processor 2100.

The wireless transceiver 2500 may include a transceiver 2510, a modem 2520, and an antenna 2530. The wireless transceiver 2500 may perform wireless communication with an external device and may receive data from or transmit data to the external device.

Additionally, application processor 2100, controller R2I, modem 2520, power controller 130, CMU 121, sub-power controller 151, block power controller 22, and/or the components included therein may include processor(s) and/or processing circuitry such as hardware including logic circuits; a hardware/software combination such as a processor executing software; or a combination thereof. For example, the processor(s) and/or processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concepts have been particularly shown and described with reference to embodiments thereof, it will be understood that various changes in form and details may be made therein without departing from the spirit and scope of the following claims.

What is claimed is:

1. A system on chip (SoC) comprising:
a memory controller configured to control a memory;
a plurality of circuitries configured to operate based on a plurality of internal clock signals, respectively, and to transmit a plurality of activity request signals, respectively to request access to the memory through a memory interface;
a system interconnect circuit configured to selectively connect the memory interface and the plurality of circuitries based on a first clock signal by,
allowing one or more of the plurality of circuitries to access the memory in an ungating period in which the first clock signal is ungated, and
inhibiting all of the plurality of circuitries from accessing the memory by simultaneously blocking generation of each of the plurality of internal clock signals in a gating period in which the first clock signal is gated; and
a power controller configured to control the first clock signal to be periodically gated in response to an active level of one or more of the plurality of activity request signals being a default setting, and control the memory to operate in a lower-power mode during a period in which the first clock signal is gated.

2. The SoC of claim 1, wherein the power controller is further configured to control the first clock signal to be gated and ungated in a first cycle, and wherein the gating period of the first clock signal is longer than the ungating period of the first clock signal.

3. The SoC of claim 1, wherein the power controller is further configured to control the first clock signal to be ungated in response to the active level of a first activity request signal among the plurality of activity request signals received from the plurality of circuitries.

4. The SoC of claim 3, wherein
a first circuitry among the plurality of circuitries is configured to transmit the first activity request signal having the active level to the power controller, and
the first circuitry is a circuitry with access to the memory in real time or has a highest performance among the plurality of circuitries.

5. The SoC of claim 3, wherein one of the plurality of circuitries comprises a data queue among the plurality of circuitries and is configured to transmit the first activity request signal having the active level to the power controller when the data queue is in a full state or an empty state.

6. The SoC of claim 1, wherein the power controller is further configured to control the first clock signal to be gated in response to the plurality of activity request signals received from the plurality of circuitries having respective inactive levels.

7. The SoC of claim 1, wherein the power controller is further configured to transmit a clock gating control signal controlling gating and ungating of the first clock signal to a first clock management circuit included in the system interconnect circuit, and transmit a power mode control signal controlling a power mode of the memory to the memory controller.

8. The SoC of claim 7, wherein the first clock management circuit is further configured to generate a plurality of clock signals used in the system interconnect circuit based on the first clock signal, and block generation of the plurality of clock signals by gating the first clock signal, in response to a first level of the clock gating control signal indicating gating enable.

9. The SoC of claim 7, further comprising:
a sub-interconnect circuit configured to operate based on a second clock signal to connect at least two of the plurality of circuitries to the system interconnect circuit, and control gating of the second clock signal based on the clock gating control signal received from the power controller.

10. The SoC of claim 9, wherein the sub-interconnect circuit comprises a second clock management circuit configured to generate a plurality of clock signals used in the sub-interconnect circuit based on the second clock signal; and
a sub-controller configured to
receive the clock gating control signal from the power controller, control gating of the second clock signal based on the clock gating control signal,
generate an activity request signal based on at least one activity signal of a high importance among at least two active signals received from the at least two of the plurality of circuitries, and
transmit the activity request signal to the power controller.

11. The SoC of claim 7, wherein at least one of the plurality of circuitries comprises a third clock management circuit configured to generate a plurality of clock signals used in the at least one of the plurality of circuitries based on a third clock signal, and gate the third clock signal based on the clock gating control signal received from the power controller.

12. The SoC of claim 1, wherein the memory comprises a dynamic random access memory (DRAM).

13. The SoC of claim 1, wherein the power controller is further configured to periodically gate the first clock signal in the lower-power mode of a system and adjust a dynamic voltage and frequency scaling (DVFS) level with respect to the plurality of circuitries and the system interconnect circuit in a normal mode of the system.

14. A system on chip (SoC) comprising:
a plurality of circuitries configured to operate based on a plurality of internal clock signals, respectively, and to transmit a plurality of activity request signals, respectively to request access to a memory, the plurality of circuitries including first circuitry configured to transmit a first activity request signal and a plurality of second circuitry configured to transmit a second activity request signal;
a system interconnect circuit configured to selectively provide a data transmission path between the plurality of circuitries and the memory based on a first clock signal by,
allowing one or more of the plurality of second circuitry to access the memory in an ungating period in which the first clock signal is ungated, and
inhibiting all of the plurality of second circuitry from accessing the memory by simultaneously blocking generation of each of the plurality of internal clock signals in a gating period in which the first clock signal is gated; and
a power controller configured to,
receive an activity request signal from each of the plurality of circuitries,
control gating and ungating of the first clock signal of the system interconnect circuit based on the plurality of activity request signals received from the plurality of circuitries by ungating the first clock signal in response to an active level of the first activity request signal received from the first circuitry, and periodically gating the first clock signal in response to the active level of the second activity request signal received from the plurality of second circuitry, and
control the memory to operate in a lower-power mode during a period in which the first clock signal is gated.

15. The SoC of claim 14, wherein the active level of at least one first activity request signal is of a high importance among the plurality of activity request signals, and the second activity request signal is of a low importance among the plurality of activity request signals.

16. The SoC of claim 14, wherein the power controller is further configured to control the first clock signal to be gated in response to all of the plurality of activity request signals having respective inactive levels.

17. The SoC of claim 14, wherein
the memory is configured to operate in a normal power mode in a first period in which the first clock signal is gated, and in the lower-power mode in a second period in which the first clock signal is gated, and
at least two circuitries of the plurality of circuitries are configured to access the memory through the system interconnect circuit in the first period.

18. An application processor comprising:
a plurality of circuitries operate based on a plurality of internal clock signals, respectively, and to transmit a plurality of activity request signals, respectively;
a shared module shared by the plurality of circuitries;
an interconnect circuit configured to selectively connect the plurality of circuitries and the shared module based on a first clock signal by allowing one or more of the plurality of circuitries to access the shared module in an ungating period in which the first clock signal is ungated, and inhibiting all of the plurality of circuitries from accessing the shared module by simultaneously blocking generation of each of the plurality of internal clock signals in a gating period in which the first clock signal is gated; and
a power controller configured to
generate a gating control signal controlling the first clock signal to be periodically gated in response to an active level of one or more of the plurality of activity request signals being a default setting, and to provide the gating control signal to the interconnect circuit, and
based on a plurality of state signals received from the plurality of circuitries, adjust the gating control signal to maintain a state in which the first clock signal is gated or a state in which the first clock signal is used in the interconnect circuit.

19. The application processor of claim 18, wherein the power controller is further configured to provide a lower-power mode signal to the shared module during a period in which the first clock signal is gated.

20. The application processor of claim 18, wherein the power controller is further configured to, in response to at least one first state signal among the plurality of state signals received from at least one circuitry of a high importance among the plurality of circuitries having the active level, generate the gating control signal controlling to maintain a state in which the first clock signal is ungated.

* * * * *